US010714412B2

(12) United States Patent
Mullenix et al.

(10) Patent No.: US 10,714,412 B2
(45) Date of Patent: Jul. 14, 2020

(54) SEMICONDUCTOR PACKAGE WITH INTEGRATED PASSIVE ELECTRICAL COMPONENT

(71) Applicant: TEXAS INSTRUMENTS INCORPORATED, Dallas, TX (US)

(72) Inventors: Joyce Marie Mullenix, San Jose, CA (US); Roberto Giampiero Massolini, Pavia (IT); Rajeev D. Joshi, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/820,736

(22) Filed: Nov. 22, 2017

(65) Prior Publication Data

US 2019/0157188 A1 May 23, 2019

(51) Int. Cl.
*H01L 23/495* (2006.01)
*H01L 23/00* (2006.01)

(52) U.S. Cl.
CPC ........ *H01L 23/4952* (2013.01); *H01L 23/495* (2013.01); *H01L 23/4951* (2013.01); *H01L 23/49524* (2013.01); *H01L 23/49537* (2013.01); *H01L 23/49541* (2013.01); *H01L 23/49589* (2013.01); *H01L 24/16* (2013.01); *H01L 24/32* (2013.01); *H01L 24/13* (2013.01); *H01L 24/29* (2013.01); *H01L 24/73* (2013.01); *H01L 24/92* (2013.01); *H01L 2224/13147* (2013.01); *H01L 2224/16245* (2013.01); *H01L 2224/2919* (2013.01); *H01L 2224/32265* (2013.01); *H01L 2224/73253* (2013.01); *H01L 2224/92225* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01)

(58) Field of Classification Search
CPC . H01L 2224/32265; H01L 2924/19041; H01L 2924/19042; H01L 2924/19043; H01L 2924/19104; H01L 23/4951; H01L 23/4952; H01L 23/49524; H01L 23/49537; H01L 28/10; H01L 28/20; H01L 28/40
See application file for complete search history.

(56) References Cited

U.S. PATENT DOCUMENTS

| | | | | |
|---|---|---|---|---|
| 2004/0238857 A1* | 12/2004 | Beroz | ................ | H01L 23/3107 257/232 |
| 2011/0024884 A1* | 2/2011 | Xue | .................. | H01L 23/49562 257/676 |
| 2018/0190573 A1 | 7/2018 | Mullenix et al. | | |

* cited by examiner

*Primary Examiner* — Thanhha S Pham
(74) *Attorney, Agent, or Firm* — Michael A. Davis, Jr.; Charles A. Brill; Frank D. Cimino (57) ABSTRACT

A semiconductor package includes a leadframe comprising input/output pins accessible external to the semiconductor package and a semiconductor die electrically connected to the leadframe. The semiconductor package also includes a passive electrical component mounted on a side of the semiconductor die opposite the leadframe. Mold compound encapsulates the passive electrical component, semiconductor die, and leadframe to form the semiconductor package. Associated methods are disclosed as well.

15 Claims, 7 Drawing Sheets

SEMICONDUCTOR PACKAGE WITH INTEGRATED PASSIVE ELECTRICAL COMPONENT

BACKGROUND

Many types of integrated circuits (ICs) have input/output (I/O) pins that are used to connect external passive or active components. An IC (also referred to as semiconductor die) often is attached to a leadframe and then surrounded by a mold compound to form a semiconductor package. The package is then attached to a printed circuit board (PCB). A capacitor, inductor, or other type of passive electrical component may be attached to the same PCB. Through traces on the PCB, the passive electrical component is electrically connected to one or more I/O pins of the leadframe, and through the leadframe to the IC. A considerable amount of space is occupied by the semiconductor package and external passive components. Space is a premium in many applications such as smart phones or other types of mobile consumer electronic devices. Further, interconnection parasitics resulting from longer interconnection pathways can detrimentally impact performance

SUMMARY

In one example, a semiconductor package includes a leadframe comprising input/output pins accessible external to the semiconductor package and a semiconductor die electrically connected to the leadframe. The semiconductor package also includes a passive electrical component mounted on a side of the semiconductor die opposite the leadframe to sandwich the semiconductor die between the passive electrical component and the leadframe. Mold compound encapsulates the passive electrical component, semiconductor die, and leadframe to form the semiconductor package.

Another example is directed to a method that includes forming a first magnetic material on a first surface of a conductive loop and forming a second magnetic material on a second surface of the conductive loop opposite the first surface to form an inductor. The method further includes attaching a semiconductor die to a leadframe and attaching the inductor to the leadframe with solder balls. The semiconductor die is sandwiched between the inductor and the leadframe.

In yet another example, a semiconductor package includes a leadframe comprising input/output pins accessible external to the semiconductor package. A semiconductor die also is included and is electrically connected to the leadframe. An inductor includes a conductive element sandwiched between a pair of magnetic elements and is attached to the leadframe with solder balls so that the inductor is on a side of the semiconductor die opposite the leadframe. Mold compound encapsulates the inductor, semiconductor die, and leadframe to form a semiconductor package.

BRIEF DESCRIPTION OF THE DRAWINGS

For a detailed description of various examples, reference will now be made to the accompanying drawings in which.

2

DETAILED DESCRIPTION

The disclosed embodiments are directed to a semiconductor package with an integrated passive electrical device. That is, the passive electrical device is contained within the package but outside the semiconductor die. In one embodiment, the leadframe, semiconductor die, and passive electrical component are in a stacked arrangement with the passive electrical component mounted on a side of the semiconductor die opposite the leadframe. Thus, rather than placing the passive electrical component on a PCB outside the semiconductor package, the passive electrical component is integrated into the semiconductor package vertically stacked relative to the semiconductor die and its leadframe. The passive electrical component may comprise one or more of an inductor, a capacitor, a resistor, or other type of passive component. The techniques described herein are applicable to any semiconductor package type. Examples of such packages include quad-flat no-leads (QFN) packages, small outline integrated circuit (SOIC) packages, thin small outline package (TSOP), etc.

The resulting product has a smaller footprint (i.e., cross-sectional area) than would have been the case had the passive electrical component been disposed outside the semiconductor package. Further, the passive electrical component is closer to the semiconductor die which may have beneficial electrical properties in terms of reducing loop inductance, resistance, etc.

Figure 1A:
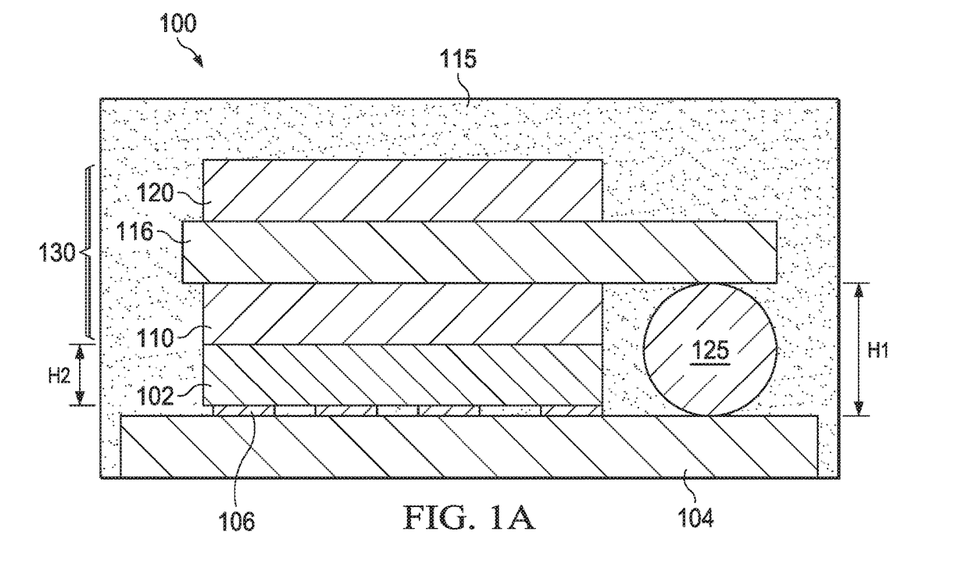
FIG. 1A illustrates a semiconductor package in accordance with an embodiment.

FIG. 1A illustrates an example of a cross-sectional side view of a semiconductor package 100 in accordance with an embodiment. The semiconductor package includes a semiconductor die 102 mounted to a leadframe 104 (e.g., copper), and a passive electrical component 130 also attached to the leadframe. The semiconductor die 102 attaches the lead frame using, for example, copper posts 106. The semiconductor die 102 contains any type of integrated circuit. In one example, the integrated circuit is a power circuit, such as a switch mode voltage converter. In that example, the integrated circuit may include one or more power transistors, lower power transistor switches, gate drivers, control circuits, etc.

The passive electrical 130 component in the example of FIG. 1A includes a conductive element 116 (e.g., copper) that spans parallel to the leadframe 104 and that is electrically connected to the leadframe through one or more solder balls 125. In FIG. 1A, the height H1 of the solder balls is greater than the height H2 of the semiconductor die 102. The conductive element 116 of the passive electrical component 130 is sandwiched between a pair of magnetic elements 110 and 120. The conductive element 116 may have a non-linear shape (e.g., curved, coil, etc.). In the example of FIG. 1, the combination of the conductive element 116 and the magnetic elements 110 and 120 forms the passive electrical component that comprises an inductor.

As an inductor, the passive electrical component has two electrical contacts that connect to separate solder balls 125, and through the solder balls 125 to contacts on the leadframe 104. Conductive portions of the leadframe 104 provide electrical connectivity between the solder balls 125 and I/O pins of the semiconductor die 102. Thus, through the solder balls 125 and leadframe 104, the passive electrical component 130 is connected to the semiconductor die. As noted above, the semiconductor die may comprise a voltage converter. In one example, the voltage regulator may comprise a buck voltage converter that includes one or more pairs of power transistors (e.g., each pair comprising a high side transistor connected to a power voltage node and a low side transistor connected to a ground node). The power transistors of each pair are connected together at a switch node. As an inductor, the passive electrical component 130 connects to the switch node. The footprint occupied by voltage converter and passive electrical component is smaller than would have been the case had the passive electrical component been located outside the semiconductor package.

Figure 1B:
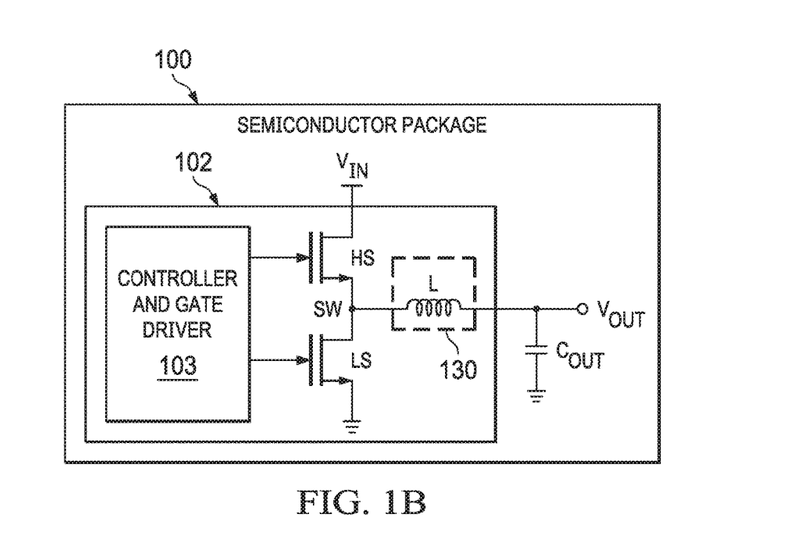
FIG. 1B shows an example of a switch mode voltage converter for which the semiconductor package is usable.

FIG. 1B shows an example of an electrical schematic for a switch mode voltage converter in which the semiconductor package 100 (and the package 200 described below) is usable. In this example, the voltage converter includes a controller and gate driver 103, a high side power transistor (HS), a low side power transistor (LS), an inductor L, and an output capacitor Cout. The controller and gate driver 103 asserts gate signal to selectively turn on and off the power transistors HS and LS. The inductor L connects to a switch node (SW) formed between the source of HS and the drain of LS. The output capacitor Cout connects to the opposing terminal of the inductor L and provides the output voltage Vout from the converter. The inductor L comprises the passive electrical component 130. The semiconductor die 102 noted above includes the controller and gate driver 103 and the power transistors HS and LS. The semiconductor package 100 integrates both the semiconductor die 102 and the inductor L.

Figure 2A:
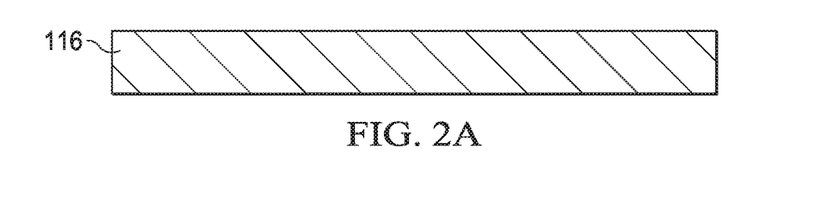
FIGS. 2A-2D illustrate an assembly process for the semiconductor package of FIG. 1.
Figure 2B:
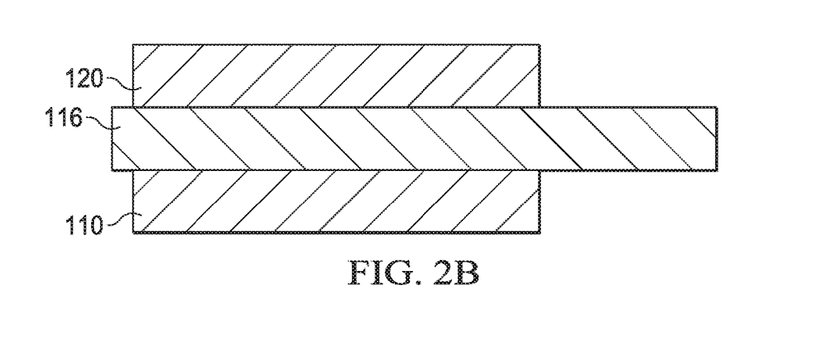

FIGS. 2A-2D show an example of assembling the semiconductor package 100 of FIG. 1. FIG. 2A illustrates the conductive element 116. The conductive element may be made from copper, or other suitable metal. The conductive element 116 is formed into the non-linear shape (e.g., loop) suitable to form an inductor. FIG. 2B illustrates the magnetic elements 110. 120 formed on opposing surfaces of the conductive element 116. In one embodiment, the magnetic elements comprise a magnetic mold compound which is applied to the opposing surfaces of the conductive element 116. In another embodiment, the magnetic elements comprise magnetic sheets that are adhered to the conductive element by way of, for example, non-conductive epoxy. Such epoxy should not be applied to the areas of the conductive element 116 to which the solder balls are to contact.

Figure 2C:
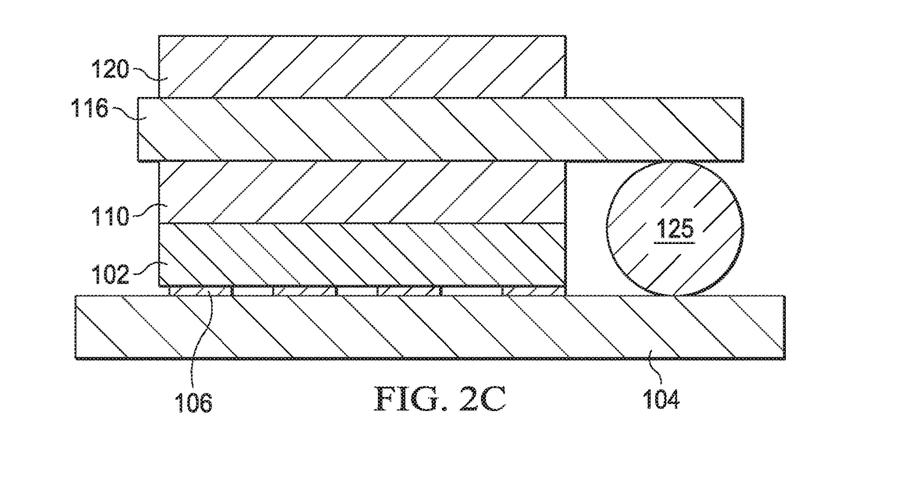
Figure 2D:
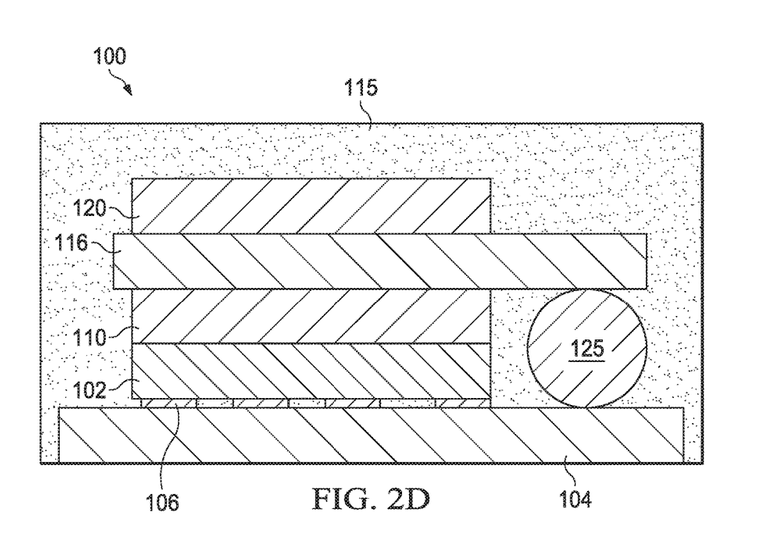

FIG. 2C illustrates the attachment of the semiconductor die 102 to the lead frame 106 via the copper posts 106 and the placement of the inductor (comprising magnetic elements 110, 120 and conductive element 116) placed on the semiconductor die 102 and electrically connected to the leadframe 104 by way of solder balls 125. The solder balls may be processed and attached to the conductive element 116 and leadframe 104 by way of a reflow step. In some embodiments, the lower magnetic element 110 may be in contact with the semiconductor die 102. In other embodiments, a dielectric or other type of protective layer may be disposed between the magnetic element 110 and semiconductor die 102. FIG. 2D illustrates the mold compound 115 to encapsulate the components to form the semiconductor package. The components of FIGS. 2A-2D may be performed on a wafer to create multiple such integrated structures. The wafer is then singulated by way of a laser or a mechanical sawing process.

Figure 3:
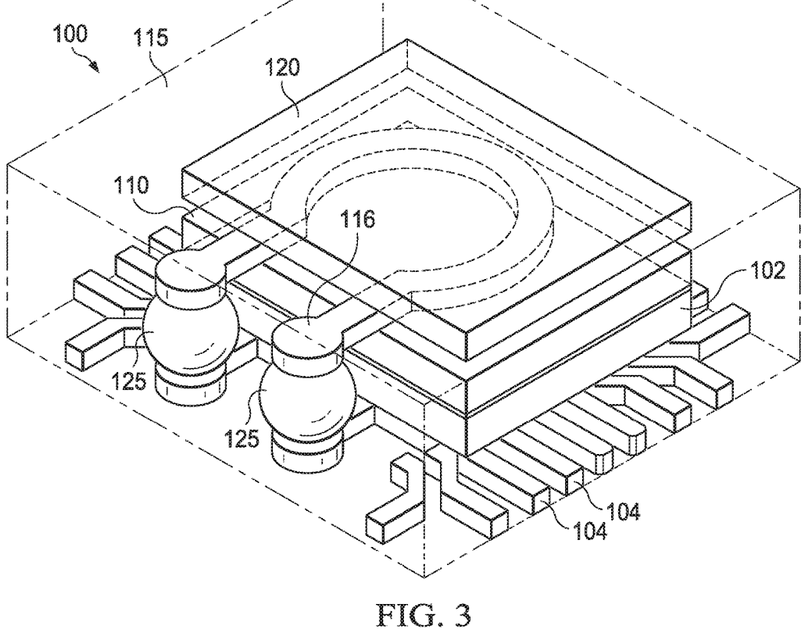
FIG. 3 shows a perspective view of the semiconductor package of FIG. 1 in accordance with an embodiment.
Figure 4:
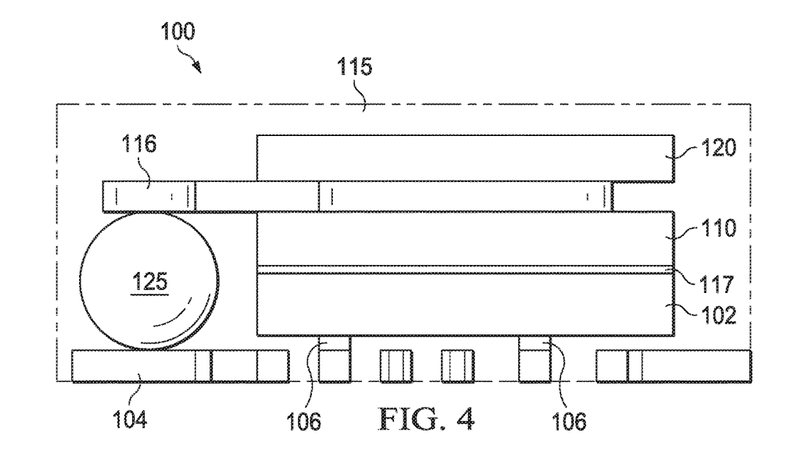
FIG. 4 shows a side view of the semiconductor package of FIG. 1 in accordance with an embodiment.

FIG. 3 shows a perspective view of the semiconductor package 100. In this example, the conductive element 116 is shown as having a curve shape to form a partial loop. The conductive element is sandwiched between the magnetic elements 110 and 120. The leadframe 104 also is shown as having a plurality of separate conductive members to provide externally-accessible connections to the semiconductor die 102. FIG. 4 shows another side view of the semiconductor package. This view also shows a layer 117 between the lower magnetic element 110 of the inductor and the top surface of the semiconductor die 102. The layer 117 may comprise a protective layer such as a mold compound or non-conductive epoxy.

Figure 5:
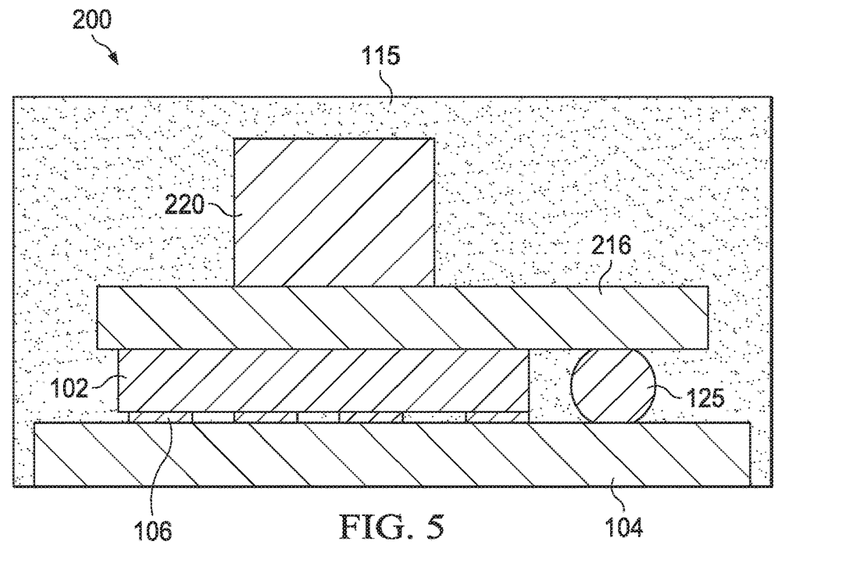
FIG. 5 illustrates a semiconductor package in accordance with another embodiment.

FIG. 5 shows another embodiment of a semiconductor package 200. As with the embodiment of FIG. 1, the semiconductor package 200 of FIG. 2 includes the semiconductor die 102 mounted to the leadframe 104 by way of copper posts 106. A conductive element 216 (e.g., copper alloy) extends along a plane generally parallel to the leadframe and rests on, or is attached to, the semiconductor die 102 and electrically connects to the leadframe by way of one more solder balls 125. As described herein above, the height of the solder balls 125 is greater than the height of the semiconductor die 102. A passive electrical component 220 is mounted to the conductive element 216. The number of solder balls 125 may correspond to the number of terminals (not shown) of the passive electrical component 220. In some embodiments, the passive component comprises at least one of an inductor, a capacitor, and a resistor. The components shown in FIG. 5 are encapsulated in a mold compound 115 to form the semiconductor package.

Figure 6A:
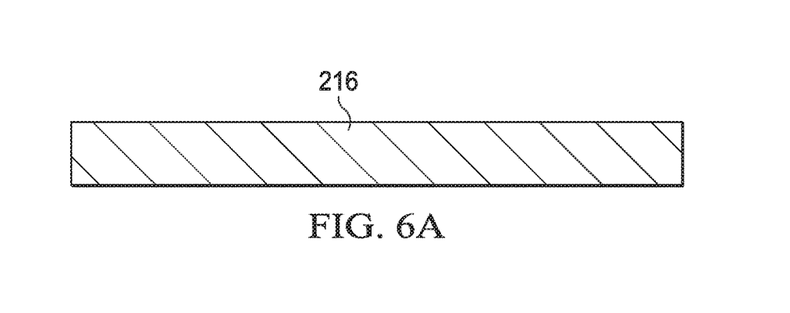
FIGS. 6A-6D illustrate an assembly process for the semiconductor package of FIG. 5.
Figure 6B:
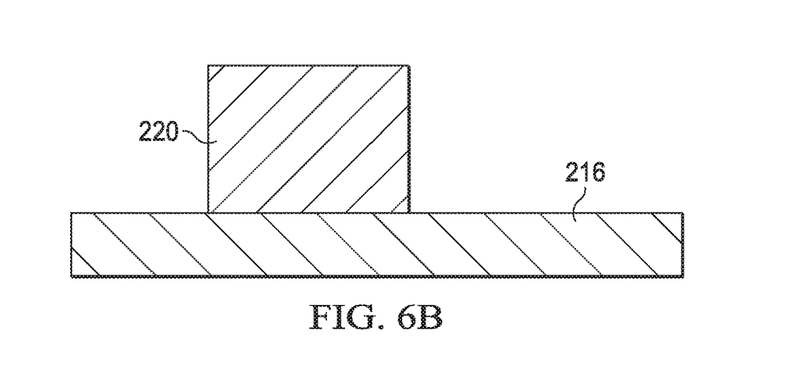
Figure 6C:
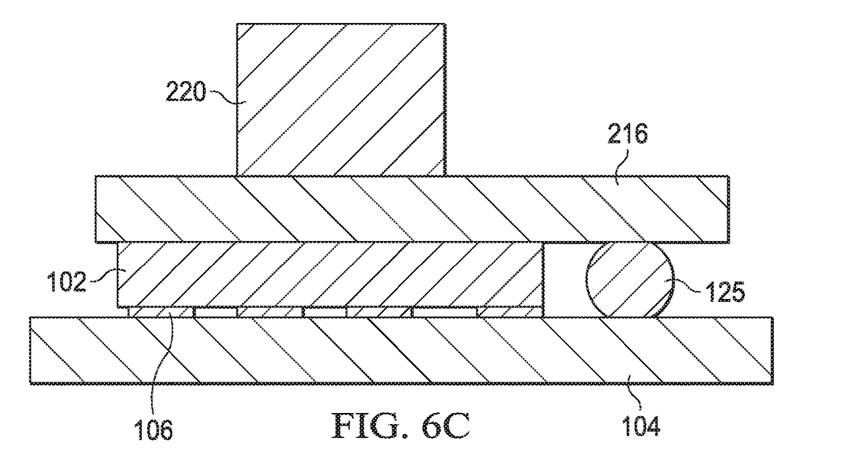
Figure 6D:
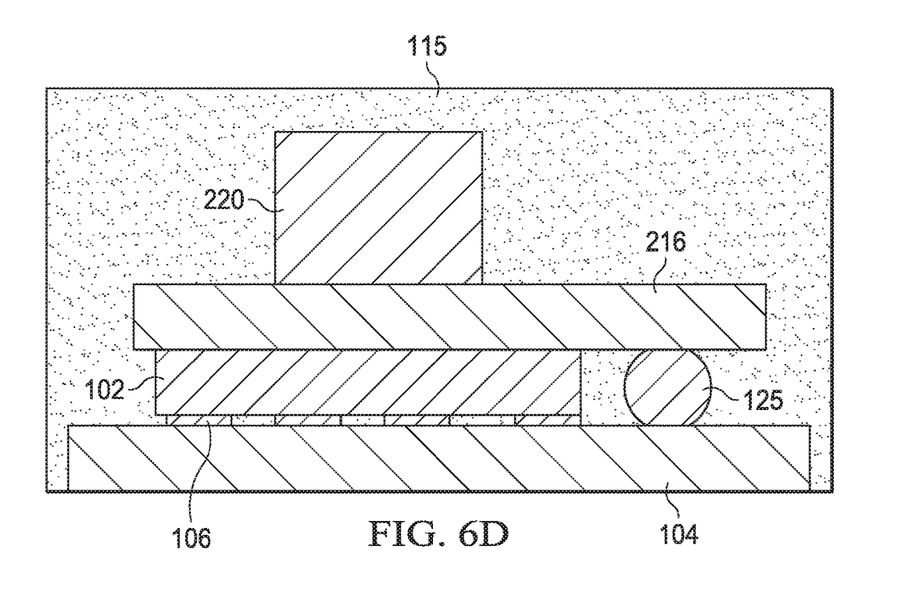

FIGS. 6A-6D show an example of assembling the semiconductor package 200 of FIG. 5. FIG. 6A illustrates the conductive element 116, which provides connectivity between the passive electrical component 220 to the solder balls 125. In the partial assembly of FIG. 2B, the passive electrical component 220 has been mounted to the conductive element 116. FIG. 2C shows the attachment of the semiconductor die 102 to the lead frame 106 via the copper posts 106 and the placement of the passive electrical component and conductive element 216 on the semiconductor die 102 and electrically connected to the leadframe 104 by way of solder balls 125. In some embodiments, the conductive element 216 may be in contact with the semiconductor die 102. In other embodiments, a dielectric or other type of protective layer may be disposed between the conductive element 216 and the semiconductor die 102. FIG. 6D shows the mold compound 115 to encapsulate the components to form the semiconductor package 200.

Figure 7:
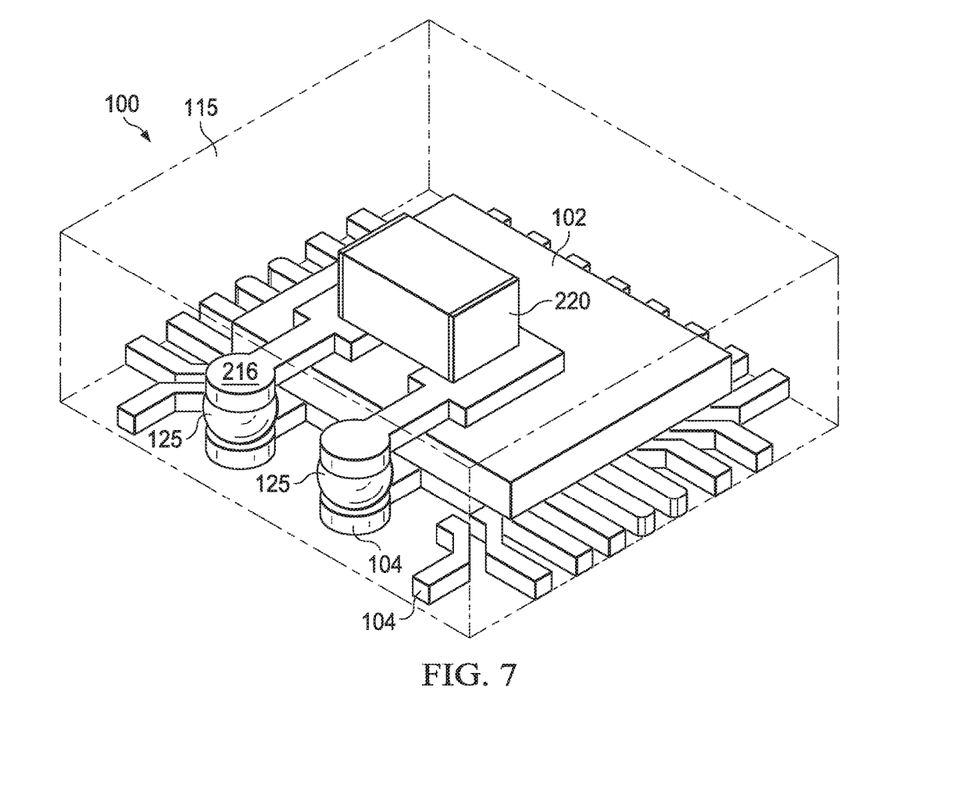
FIG. 7 illustrates a perspective view of the semiconductor package of FIG. 5.

FIG. 7 shows a perspective view of the semiconductor package 200 with a stacked arrangement of leadframes. In this example, a smaller leadframe 216 is shown electrically connecting the passive electrical component 220 to a larger leadframe 104 through the solder balls 125. The passive electrical component (e.g., inductor) is mounted on a side of the semiconductor die 102 opposite the leadframe in a sandwich arrangement. The leadframe 104 also is shown as having a plurality of separate conductive members to provide externally-accessible connections to the semiconductor die 102. In this example, the leadframe 104 can be formed and components such as the semiconductor die placed on top of the leadframe 104, and attached to the leadframe by way of solder. The components then can be reflowed and then overmolded. Solder balls 125 then can be attached to the larger leadframe 104. The smaller lead frame 216 on which the passive electrical component 220 is attached can be attached to the solder balls thereby forming a stacked arrangement (passive electrical component 220 on top of semiconductor die 102 on top of leadframe 104). Another mold compound encapsulates the passive electrical component 220, semiconductor die 102, and leadframe 104 to form the final semiconductor package.

In this description, the terms "couple" and "couples" mean either an indirect or direct wired or wireless connection. Thus, if a first device couples to a second device, that connection may be through a direct connection or through an indirect connection via other devices and connections.

Modifications are possible in the described embodiments, and other embodiments are possible, within the scope of the claims.

What is claimed is:

1. A package, comprising:
   a leadframe including conductive pins;
   a semiconductor die having opposite first and second sides, the first side of the semiconductor die having a contact connected to the leadframe;
   a solder ball connected to the leadframe;
   first and second magnetic elements, the first magnetic element on the second side of the semiconductor die;
   a conductive element at least partially between the first and second magnetic elements, the conductive element connected through the solder ball to the leadframe; and
   mold compound encapsulating the conductive element, the first and second magnetic elements, the solder ball, the semiconductor die and the leadframe except at least a portion of the conductive pins.

2. The package of claim 1, wherein the leadframe includes a conductive pathway between the solder ball and the contact of the semiconductor die.

3. The package of claim 1, wherein a height of the solder ball is greater than a height of the semiconductor die.

4. The package of claim 1, wherein the conductive element includes at least one of an inductor, a capacitor or a resistor.

5. The package of claim 1, wherein the conductive element has a non-linear shape.

6. The package of claim 1, wherein the semiconductor die includes a voltage converter circuit.

7. A package, comprising:
   a leadframe including conductive pins;
   a semiconductor die having opposite first and second sides, the first side of the semiconductor die having a contact connected to the leadframe;
   solder balls connected to the leadframe;
   first and second magnetic elements, the first magnetic element on the second side of the semiconductor die;
   an inductor including a conductive element, the conductive element at least partially between the first and second magnetic elements, and the inductor connected through the solder balls to the leadframe; and
   mold compound encapsulating the conductive element, the first and second magnetic elements, the solder balls, the semiconductor die and the leadframe except at least a portion of the conductive pins.

8. The package of claim 7, wherein heights of the solder balls are greater than a height of the semiconductor die.

9. The package of claim 7, wherein the first side of the semiconductor die has first and second contacts, and the leadframe includes: a first conductive pathway between the first solder ball and the first contact; and a second conductive pathway between the second solder ball and the second contact.

10. The package of claim 7, wherein the conductive element has a non-linear shape.

11. The package of claim 7, wherein the semiconductor die includes a voltage converter circuit.

12. The package of claim 7, wherein the leadframe is a first leadframe, and the package comprises a second leadframe connected to the inductor.

13. The package of claim 12, wherein the second leadframe is connected to the first leadframe.

14. The package of claim 12, wherein the mold compound at least partially encapsulates the second leadframe.

15. The package of claim 1, wherein the conductive element is parallel to the second side of the semiconductor die.

* * * * *